(12) United States Patent
Chen et al.

(10) Patent No.: US 8,027,158 B2
(45) Date of Patent: Sep. 27, 2011

(54) SNAP RELIEVING DEVICE AND ELECTRONIC APPARATUS WITH THE SNAP RELIEVING DEVICE

(75) Inventors: Hung-Chi Chen, Taipei (TW); Chia-Te Tsao, Taipei (TW); Chung-Cheng Hua, Taipei (TW); Chong-Kuo Lai, Taipei (TW); Chien-Yuan Chen, Taipei (TW)

(73) Assignee: Compal Electronics, Inc., Taipei (TW)

( * ) Notice: Subject to any disclaimer, the term of this patent is extended or adjusted under 35 U.S.C. 154(b) by 215 days.

(21) Appl. No.: 12/356,112

(22) Filed: Jan. 20, 2009

(65) Prior Publication Data

US 2010/0058571 A1    Mar. 11, 2010

(30) Foreign Application Priority Data

Sep. 11, 2008 (TW) .............................. 97134889 A

(51) Int. Cl.
*G06F 1/16* (2006.01)
(52) U.S. Cl. .................... 361/679.58; 29/592.1; 29/700; 312/223.2; 312/333
(58) Field of Classification Search ............. 361/679.58, 361/726; 312/333
See application file for complete search history.

(56) References Cited

U.S. PATENT DOCUMENTS

| | | | |
|---|---|---|---|
| 5,465,191 A * | 11/1995 | Nomura et al. ......... 361/679.27 |
| 6,126,210 A * | 10/2000 | Tom .............................. 292/119 |
| 6,499,775 B2 * | 12/2002 | Fujiwara ...................... 292/143 |
| 6,678,154 B2 * | 1/2004 | DeLuga ................... 361/679.58 |
| 6,795,307 B2 * | 9/2004 | Arbogast et al. ......... 361/679.58 |
| 7,108,525 B2 * | 9/2006 | Hisatomi ..................... 439/159 |
| 7,375,952 B2 * | 5/2008 | Tsai ......................... 361/679.01 |
| 7,455,334 B2 * | 11/2008 | Hisatomi et al. ................ 292/80 |
| 7,609,516 B2 * | 10/2009 | Chen et al. ................ 361/679.6 |
| 7,621,420 B2 * | 11/2009 | Bandoh et al. ................ 220/326 |
| 7,626,816 B2 * | 12/2009 | Tang ......................... 361/679.58 |
| 7,796,396 B2 * | 9/2010 | Hanson ........................ 361/726 |
| 2002/0014947 A1 * | 2/2002 | Miyamoto ..................... 338/20 |
| 2002/0080560 A1 * | 6/2002 | Flegeo ......................... 361/600 |
| 2003/0035265 A1 * | 2/2003 | DeLuga ........................ 361/683 |
| 2003/0048600 A1 | 3/2003 | Hsu et al. |
| 2003/0080568 A1 * | 5/2003 | Busby et al. ................. 292/197 |
| 2003/0124890 A1 * | 7/2003 | Harasawa et al. ............ 439/159 |

* cited by examiner

*Primary Examiner* — Jayprakash N Gandhi
*Assistant Examiner* — Anthony Q Edwards
(74) *Attorney, Agent, or Firm* — Thomas, Kayden, Horstemeyer & Risley, LLP

(57) ABSTRACT

A snap relieving device includes a first movable part, a second movable part, an inclining guiding groove, a guiding piece, and a snap. The first movable part moves along a first direction. The second movable part moves along a second direction, wherein the first direction is substantially orthogonal to the second direction. The inclining guiding groove is disposed on the first movable part. The guiding piece is coupled with the inclining guiding groove and disposed on the second movable part. The snap is connected to the first movable part or the second movable part.

13 Claims, 5 Drawing Sheets

SNAP RELIEVING DEVICE AND ELECTRONIC APPARATUS WITH THE SNAP RELIEVING DEVICE

RELATED APPLICATIONS

This application claims priority to Taiwan Application Serial Number 97134889, filed Sep. 11, 2008, which is herein incorporated by reference.

BACKGROUND

1. Field of Invention

The invention is related to a snap device, more particularly, to a snap relieving device.

2. Description of Related Art

A snap structure is widely meant to fix two parts. For example, the process of manufacturing electronic apparatus usually includes combining sheet parts. The sheet parts are combined with each other by means of the snap positioned on them.

However, when a user wants to disassemble the aforesaid parts, the snap usually suffers from being fractured due to inappropriate direction and magnitude of force.

Therefore, to reduce the possibility of fracturing the snap, it is desired to design a snap relieving device, such that the snap may be dislocated from the fixed parts and prevent the snap from fracturing.

SUMMARY

According to one embodiment of the present invention, a snap relieving device includes a first movable part, a second movable part, an inclining guiding groove, a guiding piece, and a snap. The first movable part moves along a first direction. The second movable part moves along a second direction, wherein the first direction is substantially orthogonal to the second direction. The inclining guiding groove is disposed on the first movable part. The guiding piece is coupled with the inclining guiding groove and disposed on the second movable part. The snap is connected to the first movable part or the second movable part.

According to another embodiment of the present invention, a snap relieving device includes a first movable part, a second movable part, a guiding groove, and a snap. The first movable part moves along a first direction. The second movable part moves along a second direction, wherein the first direction is substantially orthogonal to the second direction. The guiding groove is disposed on the first movable part. The snap is disposed on the second movable part and coupled with the guiding groove.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
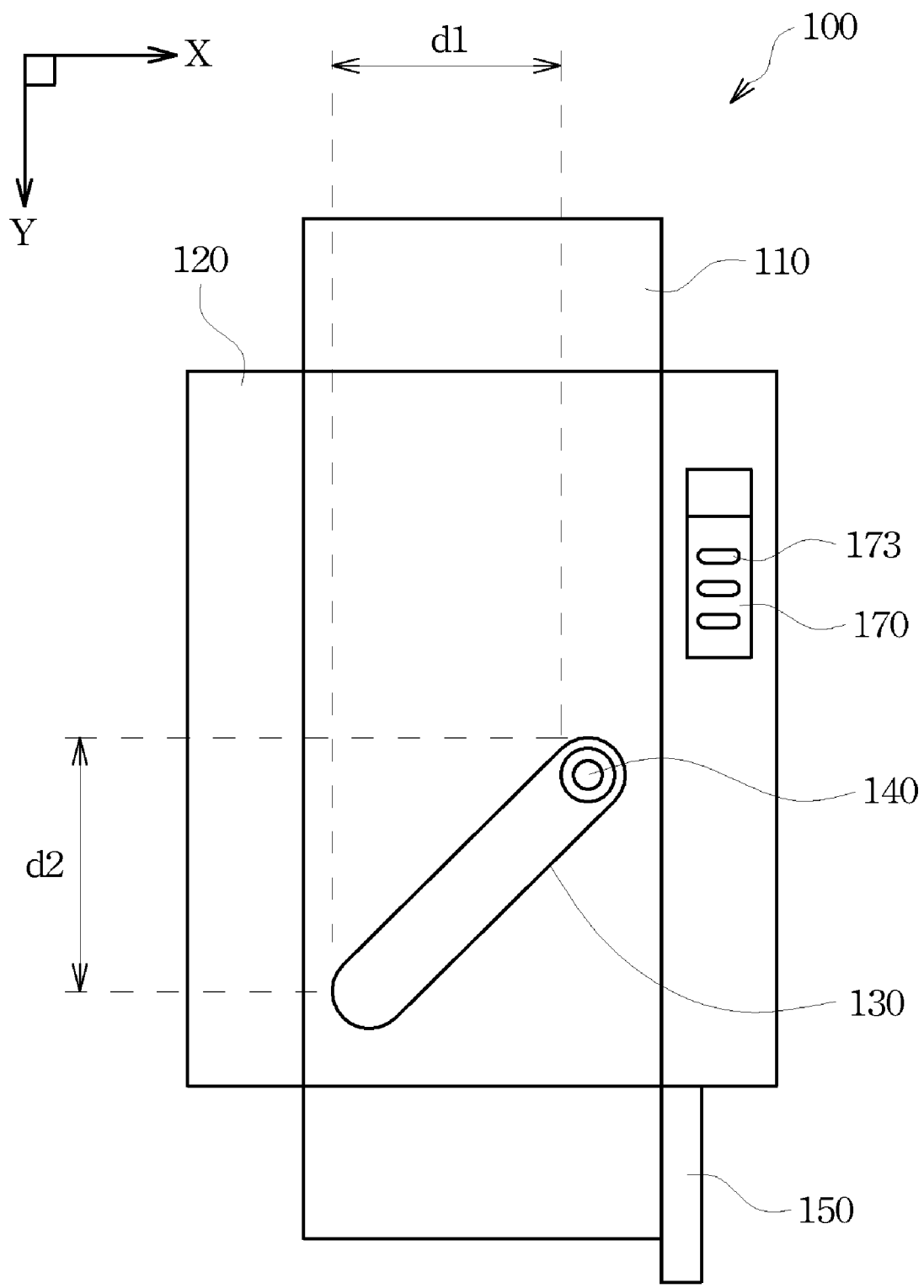
FIG. 1 depicts a partial structure of a snap relieving device according to a first embodiment of the invention.

With reference to FIG. 1, which depicts a partial structure of a snap relieving device according to a first embodiment of the invention. The snap relieving device 100 includes a first movable part 110 for moving along a first direction X, a second movable part 120 for moving along a second direction Y, an inclining guiding groove 130 disposed on the first movable part 110, a guiding piece 140 coupled with the inclining guiding groove 130 and disposed on the second movable part 120, and a snap 150 connected to the second movable part 120, wherein the first direction X is substantially orthogonal to the second direction Y.

In the first embodiment, the extending direction of the inclining guiding groove 130 is substantially parallel to the hypotenuse direction of the first movable part 110 and the second movable part 120, i.e., the extending direction of the inclining guiding groove is neither parallel with the first direction X, nor with the second direction Y. That is, the extending direction of the inclining guiding groove is the same as the hypotenuse direction summed with the first movable part and the second movable part respectively moving along the first direction X and the second direction Y. Therefore, when the second movable part 120 moves along the second direction Y, the guiding piece would slide in the inclining guiding groove 130 to bring the first movable part 110 moving along the first direction X.

In other embodiment, it is also effected that the first movable part 110 moves along the first direction X, the guiding piece would slide along the inclining guiding groove 130 to bring the second movable part 120 moving along the second direction Y. The inclining guiding groove 130 is substantially parallel to the hypotenuse direction of the first movable part 110 and the second movable part 120.

Since the guiding piece 140 and the inclining guiding groove are coupled with each other, the relative movable would occur between the first movable part 110 and the second movable part 120.

When the displacement of the first movable part 110 moves along the first direction X is supposed to be d1, and the displacement of second movable 120 would move along the second direction is supposed to be d2, the displacement of the guiding piece along the inclining guiding groove is the hypotenuse, will satisfy Pythagorean theorem, i.e. the square of the hypotenuse is equal to the sum of the squares on the displacement d1 and the displacement d2. That is, the length of the inclining guiding groove would be adjusted in accordance with the desired displacements of the first movable part 110 and the second movable part 120.

The snap 150 is connected to the second movable part 120, and when the first movable part 110 moves relative to the second movable part 120, the relative positions between the snap and engaged objects fixed by the snap vary accordingly.

The snap relieving device has a pushed part 170 connected to the second movable part 120 and positioned on one side thereof facing away from the snap.

Furthermore, a plurality of anti-slipping strips 173 would be arranged on the pushed part 170. When a user applies a force on the pushed part 170, the friction between the user and the surface of the pushed part 170 would increase by means of the anti-slipping strips 173 and facilitate the user applying the force along correct direction.

The structures of the inclining guiding groove and the guiding piece will exemplarily be given forth in the following description.

Figure 2:
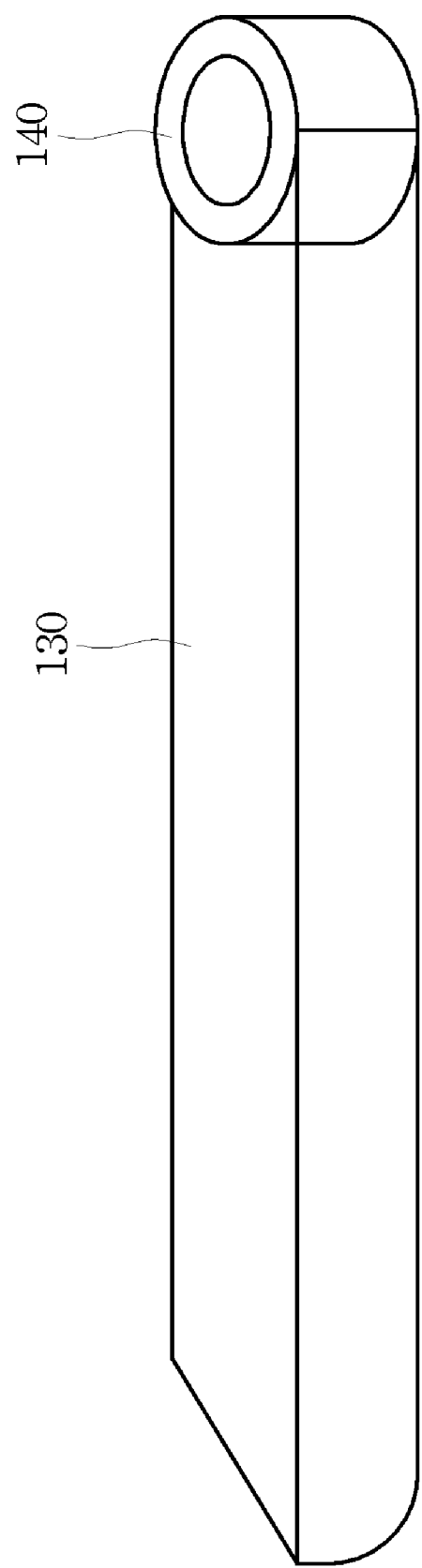
FIG. 2 depicts structures of the guiding piece and the inclining guiding groove of the snap relieving device shown in FIG. 1.

Refer to FIG. 2, which depicts structures of the guiding piece and the inclining guiding groove of the snap relieving device shown in FIG. 1. In the embodiment, the depth of the inclining guiding groove 130 is substantially equal to the height of the guiding piece 140, i.e. the guiding piece is neither higher nor lower than the outer edge of the inclining guiding groove 130, so as to prevent the guiding piece 140 from broken due to inappropriate force.

Moreover, the guiding piece is a hollow cylinder, as shown in FIG. 2, such that the guiding piece 140 is capable of sliding along the inclining guiding groove 130 by means of the side surface of the hollow cylinder. Thus, the friction between the guiding piece 140 and the inclining guiding groove 130 would be reduced.

A snap relieving device of the second embodiment will be described below.

Figure 3:
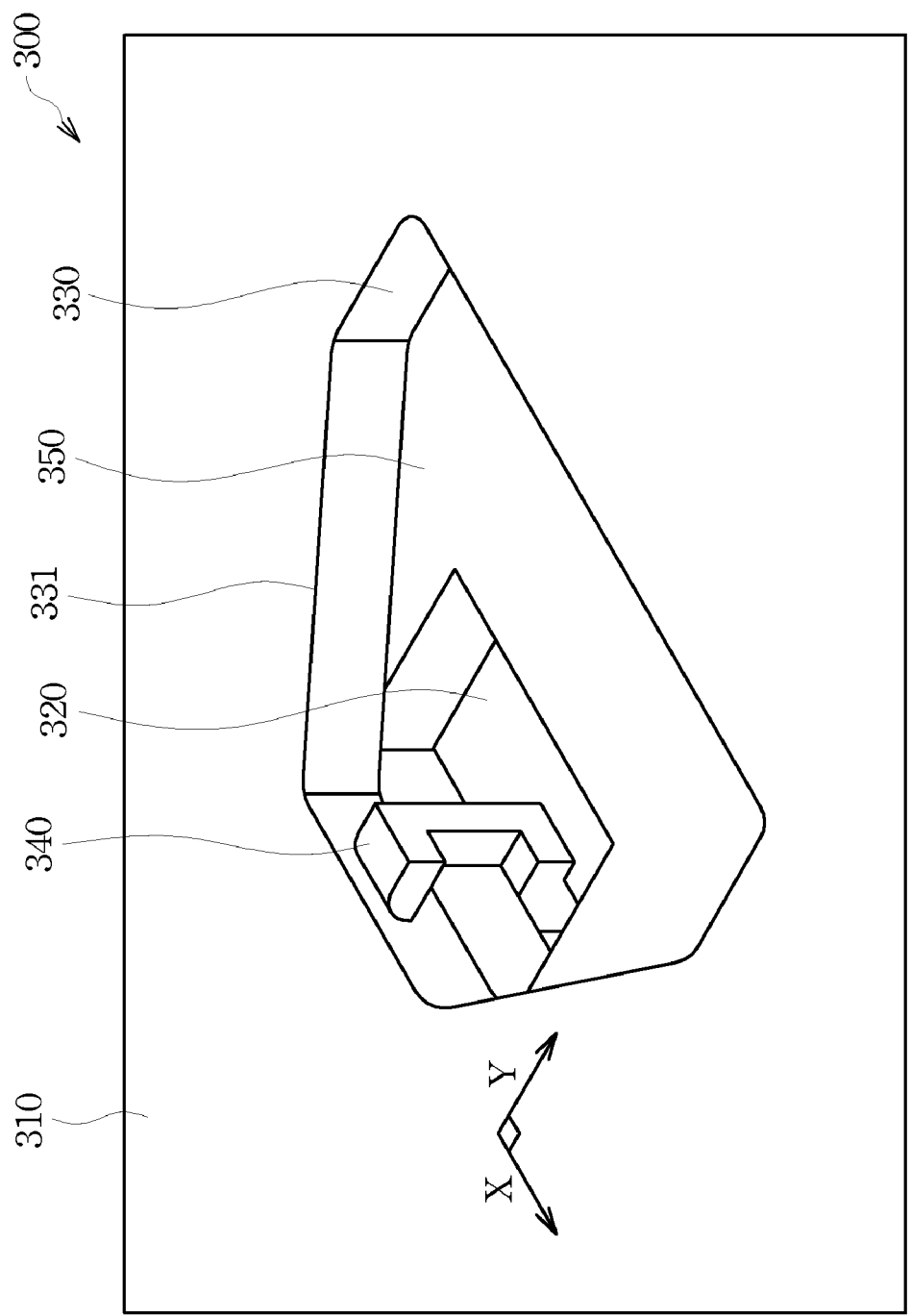
FIG. 3 is a top-view of a snap relieving device according to a second embodiment of the invention.

Refer to FIG. 3, which shows a top-view of a snap relieving device according to a second embodiment of the invention. The snap relieving device 300 includes a first movable part 310 for moving along a first direction X, a second movable part 320 for moving along a second direction Y substantially orthogonal to the first direction X, a guiding groove 330 disposed on the first movable part 310, a snap 340 disposed on the second movable part 320 and coupled with the guiding groove 330, wherein the snap 340 is positioned adjacent to an edge 331 of the guiding groove 330.

In the embodiment, the snap 340 is positioned on the second movable part 320. When the first movable part moves along the first direction X, the snap 340 would move from the edge 331 to another edge of the guiding groove 330 and bring the second movable part moving along the second direction Y.

The snap relieving device 300 also includes an engaged layer 350 positioned adjacent to the snap 340. Originally, the engaged layer and the second movable part 320 are fastened together by the snap 340. When the first movable part 310 moves along the first direction X, the engaged layer 350 moves relatively to the snap 340, and then the engaged layer 350 and the second movable part 320 are disassembled. By this way, the snap and the engaged objects fixed by it would be relieved with efficiency and accuracy.

It should be noted that the aforesaid embodiments are meant to exemplarily describe the sprit of the invention and the snap relieving device of the invention should not be limited to embodiment disclosed herein. That is, the snap 340 would not be disposed on the second movable part 320. Those skilled in the art may change the position of the snap 340 and the engaged objects fixed by it in accordance with different application requirements. For example, the snap 340 would be disposed on the engaged layer 350 or on objects adjacent to the first movable part 310 or second movable part 320. As long as the movement of the first movable part 310 is capable of bring the snap 340 sliding along the edge 331 of the guiding groove 330 and thus bring the second movable part 320 moving, so as to making the engaged objects dislocated from the snap 340. Therefore, it is possible to relieve the snap 340 and the engaged objects fixed by it with efficiency and accuracy and prevent the snap 340 from broken due to inappropriate force.

Moreover, the snap 340 would have a variety of configuration, e.g., configured inwardly, outwardly, symmetrically, and asymmetrically. The shape of the guiding groove 330 is capable of allowing the snap with such configurations positioned adjacent the edge 331 and sliding therein.

Figure 4:
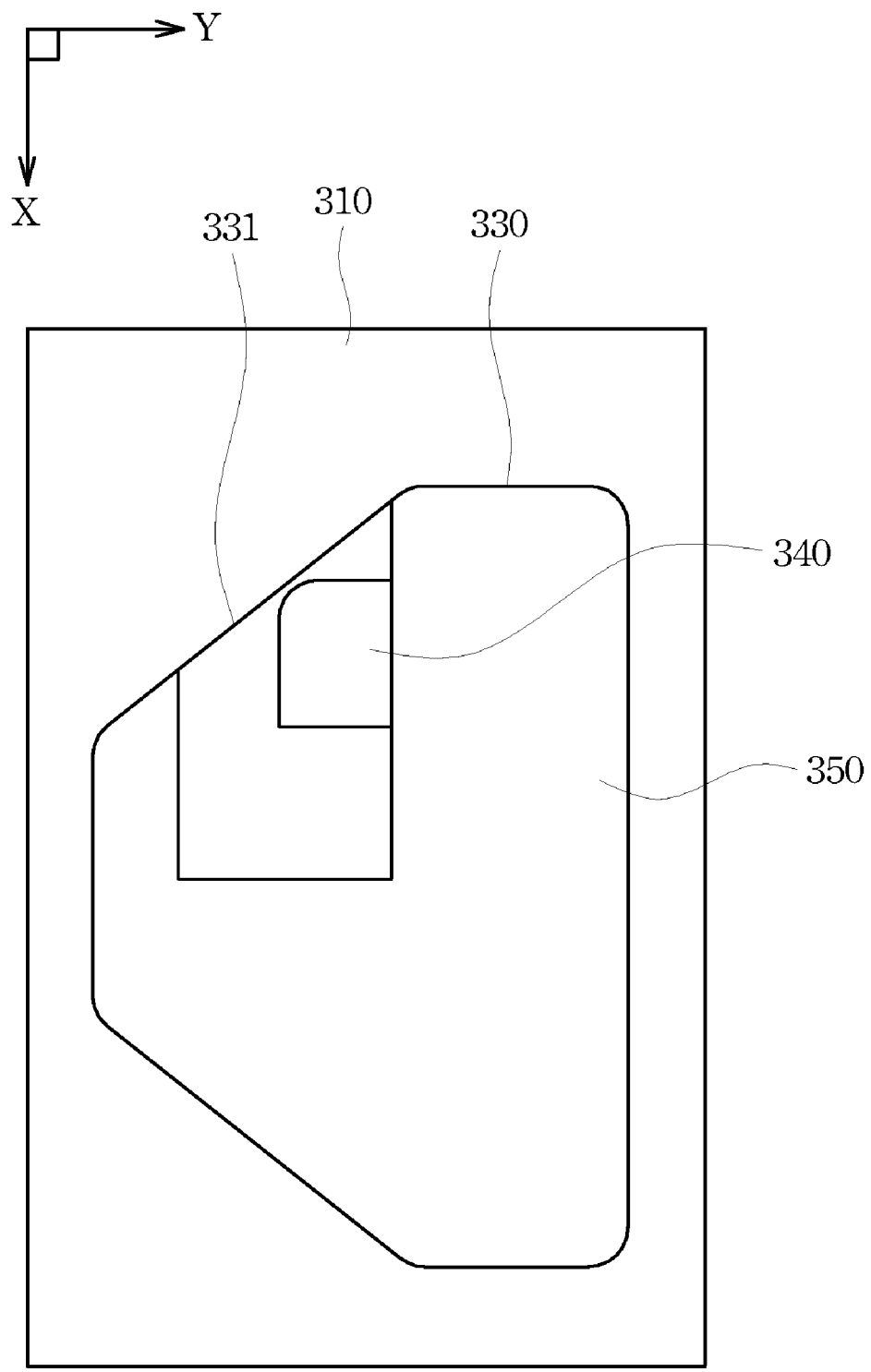
FIG. 4 is another top-view of the snap relieving device shown in FIG. 3.

Reference is made to FIG. 4, which shows another top-view of the snap relieving device shown in FIG. 3. When the first movable part 310 moves along the first direction X, the snap 340 slides from one end of the edge 331 of the guiding groove 330 to another end. When sliding, the snap 340 is very close to the edge 331, so as to make the second movable part 320 move along the second direction Y.

Figure 5:
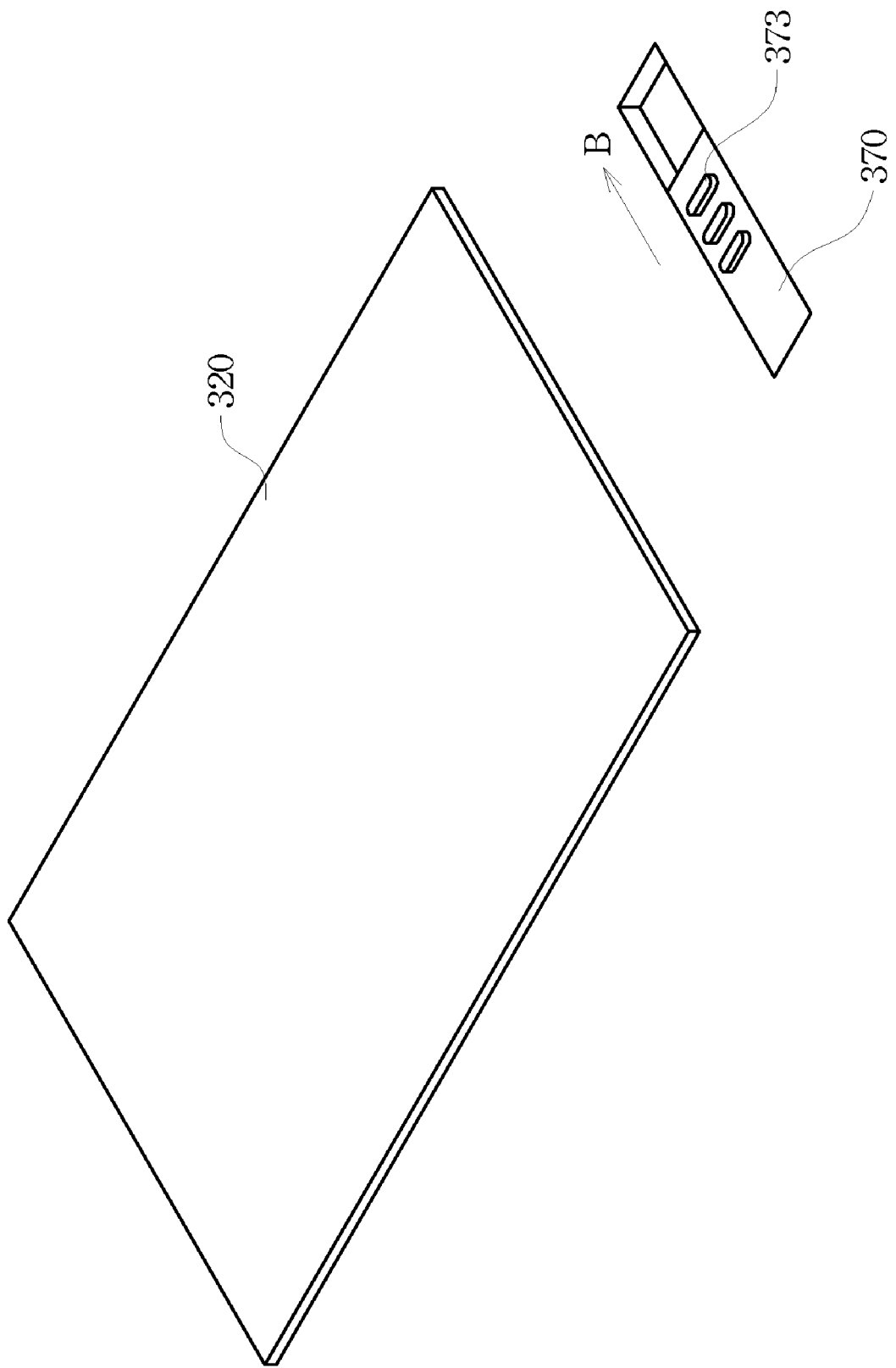
FIG. 5 is a partial bottom view of an electronic apparatus implementing the snap relieving device shown in FIG. 3.

Reference is made to FIG. 5, which shows a partial bottom view of an electronic apparatus implementing the snap relieving device shown in FIG. 3. The snap relieving device has a pushed part 370 connected to the first movable part 310 and positioned on one side thereof facing away from the snap. The force applied on the pushed part 370 is capable of pushing the first movable part 310. That is, the user pushes the pushed part 370 with a force along the direction B, and makes the first movable part 310 move, so as to making relative movement occur between the first movable part 310 and the second movable part 320. For example, the electronic device would be a notebook, and the first movable part 310 or the second movable part 320 would be disposed on the outer case of the notebook, and the engaged layer 350 would be those elements sandwiched between opposite surfaces of the outer case.

In other embodiments, the pushed part 350 would push the second movable part 320 by means of the force applied thereon, so as to make the first movable part 310 move relative to the second movable part 320.

Furthermore, a plurality of anti-slipping strips 373 would be arranged on the pushed part 370. When a user apply a force on the pushed part 370, the friction between the user and the surface of the pushed part 370 would increase by means of the anti-slipping strips 373 and facilitate the user applying the force along correct direction.

According to description provided above, the snap relieving device makes it possible for the snap to move relatively with the engaged objects fixed by it, such that the snap would be relieved with efficiency and accuracy and prevent the snap from broken duo to inappropriate force.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A snap relieving device comprising:
    a first movable part for moving along a first direction;
    a second movable part for moving along a second direction, wherein the first direction is substantially orthogonal to the second direction;
    an inclining guiding groove disposed on the first movable part, wherein the extending direction of the inclining guiding groove is substantially parallel to the hypotenuse direction of the first movable part and the second movable part;
    a guiding piece coupled with the inclining guiding groove and disposed on the second movable part; and
    a snap connected to the first movable part or the second movable part.

2. The snap relieving device of claim 1, wherein the depth of the inclining guiding groove is substantially equal to the height of the guiding piece.

3. The snap relieving device of claim 1, wherein the guiding piece is a hollow cylinder.

4. The snap relieving device of claim 1, further comprising:
a pushed part connected to the first movable part or the second movable part and positioned on one side thereof facing away from the snap.

5. The snap relieving device of claim 4, further comprising:
a plurality of anti-slipping strips arranged on the pushed part.

6. A snap relieving device comprising:
a first movable part for moving along a first direction;
a second movable part for moving along a second direction, wherein the first direction is substantially orthogonal to the second direction;
a guiding groove disposed on the first movable part, wherein the extending direction of an edge of the guiding groove is substantially parallel to the hypotenuse direction of the first movable part and the second movable part; and
a snap disposed on the second movable part and coupled with the guiding groove, wherein the snap is positioned adjacent to the edge of the guiding groove.

7. The snap relieving device of claim 6, further comprising:
an engaged layer positioned adjacent to the snap, wherein when the first movable part moves along the first direction, the engaged layer moves relatively to the snap.

8. The snap relieving device of claim 6, further comprising:
a pushed part connected to the first movable part or the second movable part and positioned on one side thereof facing away from the snap.

9. The snap relieving device of claim 8, further comprising:
a plurality of anti-slipping strips arranged on the pushed part.

10. An electronic apparatus comprising:
a case; and
a snap relieving device comprising:
a first movable part for moving along a first direction;
a second movable part deposed on the outer surface of the case for moving along a second direction, wherein the first direction is substantially orthogonal to the second direction;
an inclining guiding groove disposed on the first movable part, wherein the extending direction of the inclining guiding groove is substantially parallel to the hypotenuse direction of the first movable part and the second movable part;
a guiding piece coupled with the inclining guiding groove and disposed on the second movable part; and
a snap connected to the first movable part or the second movable part.

11. An electronic apparatus comprising:
a case; and
a snap relieving device comprising:
a first movable part for moving along a first direction;
a second movable part deposed on the outer surface of the case for moving along a second direction, wherein the first direction is substantially orthogonal to the second direction;
an inclining guiding groove disposed on the first movable part, wherein the extending direction of an edge of the inclining guiding groove is substantially parallel to the hypotenuse direction of the first movable part and the second movable part; and
a snap disposed on the second movable part and coupled with the inclining guiding groove, wherein the snap is positioned adjacent to the edge of the inclining guiding groove.

12. A method for assembling a snap relieving device to an electronic apparatus, comprising the following steps:
deposing a snap on a second movable part;
connecting the snap to a guiding groove of a first movable part, wherein the extending direction of an edge of the guiding groove is substantially parallel to the hypotenuse direction of the first movable part and the second movable part;
sliding the snap along the edge of the guiding groove and bring the second movable part moving, wherein the moving directions of the first movable part and the second movable part are substantially orthogonal; and
engaging the second movable part to a case of the electronic apparatus.

13. A method for releasing a snap relieving device from an electronic apparatus, comprising the following steps:
moving a pushed part and relatively acting a second movable part along a second direction;
pushing a first movable part along a first direction, wherein the first direction is substantially orthogonal to the second direction;
sliding relatively to a snap along the second direction in a guiding groove of the first movable part, wherein the snap is positioned adjacent to an edge of the guiding groove, and the extending direction of the edge of the guiding groove is substantially parallel to the hypotenuse direction of the first movable part and the second movable part; and
releasing the second movable part from a case of the electronic apparatus.

* * * * *